(12) United States Patent
Jung

(10) Patent No.: US 7,473,602 B2
(45) Date of Patent: Jan. 6, 2009

(54) METHOD OF FORMING SOURCE CONTACT OF NAND FLASH MEMORY

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 376 days.

(21) Appl. No.: 11/447,778

(22) Filed: Jun. 6, 2006

(65) Prior Publication Data

US 2007/0099382 A1    May 3, 2007

(30) Foreign Application Priority Data

Jun. 7, 2005   (KR) ................... 10-2005-0048295

(51) Int. Cl.
*H01L 21/336*    (2006.01)
(52) U.S. Cl. ................... 438/258; 257/E21.69
(58) Field of Classification Search .............. 438/201, 438/211, 258, 267; 257/E21.69
See application file for complete search history.

(56) References Cited

U.S. PATENT DOCUMENTS

| | | | | |
|---|---|---|---|---|
| 6,057,193 | A * | 5/2000 | Wang et al. ............. | 438/266 |
| 6,380,032 | B1 * | 4/2002 | Lee et al. ............... | 438/257 |
| 6,570,214 | B1 | 5/2003 | Wu ........................ | 257/315 |
| 6,573,142 | B1 * | 6/2003 | Hsieh ..................... | 438/266 |
| 6,765,258 | B1 | 7/2004 | Wu ........................ | 257/315 |
| 2003/0218203 | A1 | 11/2003 | Hsieh ..................... | 257/315 |
| 2004/0084732 | A1 | 5/2004 | Hsieh ..................... | 257/390 |
| 2004/0119106 | A1 | 6/2004 | Hsieh ..................... | 257/314 |
| 2005/0026349 | A1 | 2/2005 | Forbes et al. ............ | 438/211 |

FOREIGN PATENT DOCUMENTS

| | | |
|---|---|---|
| KR | 10-2002-0049929 A | 6/2002 |
| KR | 10-2005-0112990 A | 12/2005 |
| KR | 10-2005-0112992 A | 12/2005 |

* cited by examiner

*Primary Examiner*—Chandra Chaudhari
(74) *Attorney, Agent, or Firm*—Marshall, Gerstein & Borun LLP

(57) ABSTRACT

A method of forming a source contact of a NAND flash memory, including the steps of forming a tunnel oxide film on a semiconductor substrate, and then removing the tunnel oxide film in a region in which the source contact will be formed; sequentially forming a first polysilicon layer and a dielectric layer on the entire structure, and then removing the dielectric layer of a region in which select transistors will be formed; sequentially forming a second polysilicon layer on the regions for which the dielectric layer has been removed, forming a conductive film on the second polymer layer, and forming a hard mask on the conductive film; performing an etch process using a gate mask to etch a cell region up to the dielectric layer and at the same time, to etch the region in which the source contact will be formed up to on the tunnel oxide film, thereby forming source lines; performing an ion implantation process on the semiconductor substrate exposed at both sides of the source lines; sequentially etching the dielectric layer, the first polysilicon layer, and the tunnel oxide film of the cell region and the select transistor region, forming a cell gate and a select transistor gate; burying an insulating layer between the cell gate and the select transistor gate, and the source contact, and then forming an interlayer insulating layer on the entire structure; and etching a desired region of the interlayer insulating layer to form contacts through which the source lines are exposed.

4 Claims, 3 Drawing Sheets

W2  W1  W0  Select Tr            Select Tr  W0  W1  W2

Change of gate layout

W2  W1  W0  Select Tr  Source Line  Select Tr  W0  W1  W2

METHOD OF FORMING SOURCE CONTACT OF NAND FLASH MEMORY

BACKGROUND

1. Field of the Invention

The invention relates generally to a method of forming a source contact of a NAND flash memory and, more particularly, to a method of forming a source contact of a NAND flash memory, wherein source lines are formed simultaneously with the gate formation process, whereby there is no reduction in the Depth of Focus (DOF) even if the size of select transistors is shrunk.

2. Discussion of Related Art

As the line width of flash memory devices has become smaller, minute and the depth of contact holes has increased, electrical interconnections between upper and lower lines in the contact hole has become more difficult.

In general, in the flash memory device, an open area exists between the select transistors including a source select transistor (SST) and a drain select transistor (DST) in order to secure the space with the source lines to be formed after the formation of the gate.

The select transistor is substantially an important factor to decide the die size of the flash memory device. To reduce the cell size, it is necessary to reduce the select transistor size.

However, since a wide-open area exists between the select transistors as described above the DOF is reduced if the select transistors are reduced in size. Accordingly, a problem arises because it is very difficult to reduce the size of the select transistors to a specific size or less.

In other words, in the case where a minute metal line is to be formed by a photolithography process (as is generally used in the metal line), the step by the topology of the interlayer insulating layer causes a defocus phenomenon in the photolithography process for forming the metal wiring or the contact hole because an optical system has a relatively shallow DOF. As a result, there is a problem in that pattern failure is generated.

SUMMARY OF THE INVENTION

In one embodiment, the invention provides a method of forming a source contact of a NAND flash memory, wherein source lines are formed simultaneously with the gate formation process, whereby there is no reduction in the Depth of Focus (DOF) even if the size of select transistors is reduced.

In another embodiment, the invention provides a method of forming a source contact of a NAND flash memory, wherein source lines are formed simultaneously with the gate formation process, whereby an additional metal deposition or metal polishing process for forming the source lines can be omitted, thus reducing the cost, and a misalignment problem between the source contact mask and the gate select transistor in the related art can be solved.

A method of forming a source contact of a NAND flash memory device according to one embodiment of the invention includes the steps of forming a tunnel oxide film in a semiconductor substrate, and then removing the tunnel oxide film of a region in which the source contact will be formed; sequentially forming a first polysilicon layer and a dielectric layer on the entire structure, then removing the dielectric layer of a region in which select transistors will be formed; sequentially forming a second polysilicon layer on the regions for which the dielectric layer has been removed, forming a conductive film on the second polysilicon layer, and forming a hard mask on the conductive film; performing an etch process using a gate mask so that a cell region is etched up to on the dielectric layer and simultaneously etching the region in which the source contact will be formed up to on the tunnel oxide film, thereby forming source lines; performing an ion implantation process on the semiconductor substrate exposed at both sides of the source lines; etching the dielectric layer, the first polysilicon layer, and the tunnel oxide film of the cell region and the select transistor region, forming a cell gate and a select transistor gate; burying an insulating layer between the cell gate and the select transistor gate, and the source contact, and then forming an interlayer insulating layer on the entire structure; and etching a desired region of the interlayer insulating layer to form contacts through which the source lines are exposed.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings, wherein.

DETAILED DESCRIPTION OF EMBODIMENTS

In the following detailed description, only certain exemplary embodiments of the invention have been shown and described simply by way of illustration.

Figure 1A:
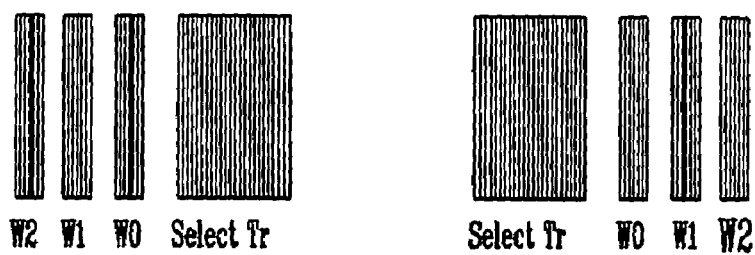
FIG. 1a shows the related art gate layout and FIG. 1b shows a gate layout formed by a method of forming a source contact of a NAND flash memory according to an embodiment of the invention.
Figure 1B:
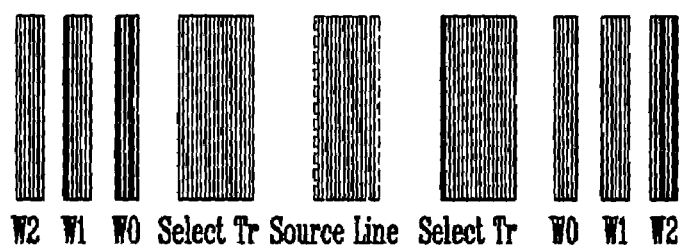

FIG. 1a shows the related art gate layout and FIG. 1b shows a gate layout formed by a method of forming a source contact of a NAND flash memory according to an embodiment of the invention.

In the gate layout diagram, a plurality of select transistors ("Select Tr") and a plurality of word lines ("W0, W1, W2") are shown. As shown in FIG. 1a, in the related art gate layout diagram, a wide-open area exists between the select transistors. If the size of the select transistors is reduced, the Depth of Focus (DOF) is reduced. It is very difficult to reduce the size of the select transistors to a specific size or less.

Accordingly, if the source lines are formed simultaneously with the gate according to an embodiment of the invention as shown in FIG. 1b, the size of the open area between the select transistors is reduced. As a result, the DOF is not reduced even if the size of the select transistors is shrunk.

Figure 2A:
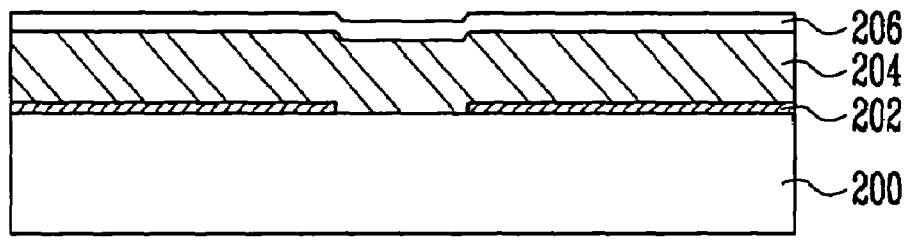
FIGS. 2a to 2f are cross-sectional view illustrating process steps of forming the source contact of the NAND flash memory according to an embodiment of the invention.

FIGS. 2a to 2f are cross-sectional view illustrating process steps of forming the source contact of the NAND flash memory according to an embodiment of the invention. FIG. 2a is a cross-sectional view of a NAND flash memory, in which after a tunnel oxide film is formed on a semiconductor substrate of an active region divided by an isolation film, the tunnel oxide film of a region in which a source contact will be formed is removed, and polysilicon layer and a dielectric layer are sequentially formed in the region of the semiconductor substrate from which the tunnel oxide film and the tunnel oxide film have been removed.

As a preparation step of forming the source contact of the NAND flash memory, after a tunnel oxide film 202 is formed on a semiconductor substrate 200, the tunnel oxide film 202 of a region in which a source contact will be formed is removed by a tunnel oxide film open mask.

A first polysilicon layer 204 is formed on the tunnel oxide film 202 and the semiconductor substrate of the removed tunnel oxide film. A dielectric layer 206 is then formed on the entire structure, including first polysilicon layer 204.

Figure 2B:
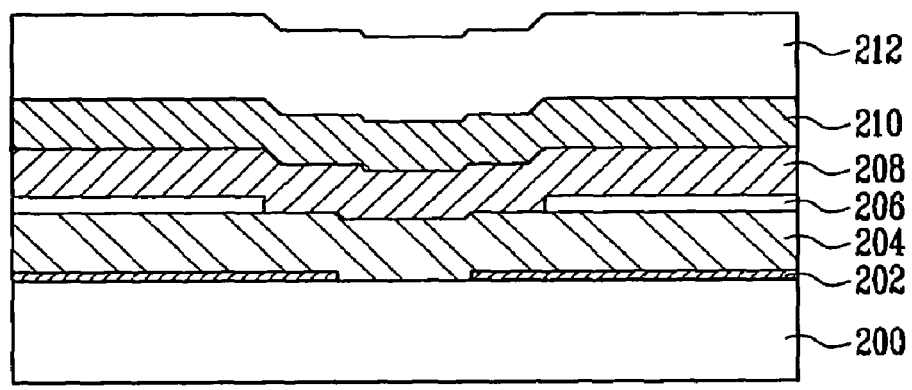

Referring to FIG. 2b, the dielectric layer 206 of a region in which select transistors will be formed is removed. A second polysilicon layer 208 is formed on the regions from which the dielectric layer 206 has been removed.

Thereafter, a conductive film 210 made of tungsten (W), aluminum (Al) or other suitable conductive material is formed on the second polysilicon layer 208. A hard mask 212, such as a nitride film (N), is formed on the conductive film 210.

Figure 2C:
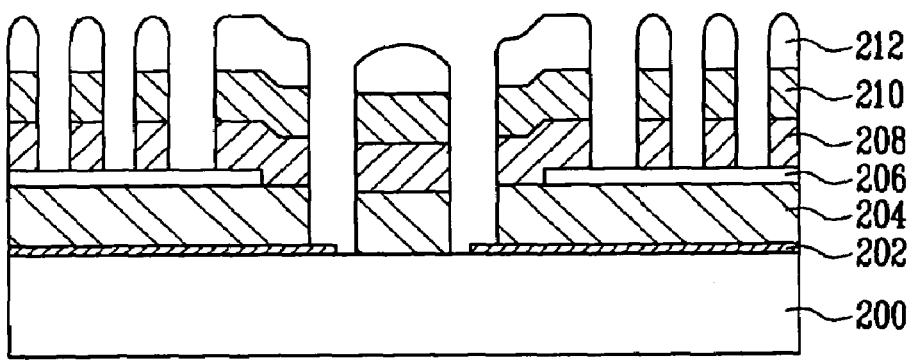

Referring to FIG. 2c, an etch process using a gate mask is performed to etch the cell region using the dielectric layer 206 as an etch-stop layer and to etch the region in which the source contact will be formed up to a region in which the semiconductor substrate 200 and the tunnel oxide film 202 are formed at the same time, thereby forming source lines.

An ion implantation process using an implant ion performed so that am ion implantation region is formed below the source lines. However, the ion implantation region is omitted in the drawings.

Figure 2D:
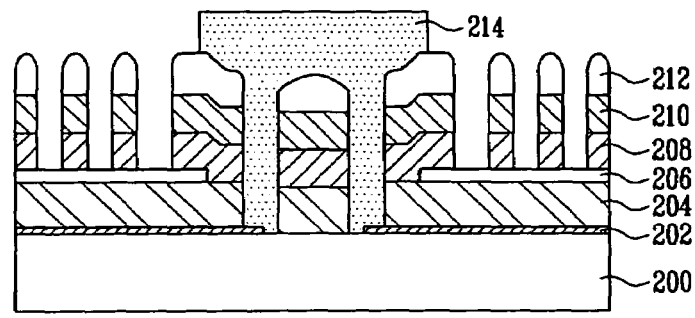

Referring to FIG. 2d, a photoresist film 214 is formed in the region in which the source lines are formed. A Self-Aligned Etch (SAE) mask process through which only the cell region is opened is then performed.

If the self-aligned etch mask process of FIG. 2d is performed, the dielectric layer 206 and the first polysilicon layer 204 of the cell region are sequentially etched. In a similar way, the tunnel oxide film 202 remaining in the region in which the source lines are formed is also etched.

At this time, in peripheral transistors (cell gate and select transistor gate) formed at both sides of the source lines, the dielectric layer 206 remains in small quantities in view of the process. However, it does not matter even if the dielectric layer 206 is not completely removed because the first polysilicon layer 204 and the second polysilicon layer 208 of the peripheral transistor become conductive.

Figure 2E:
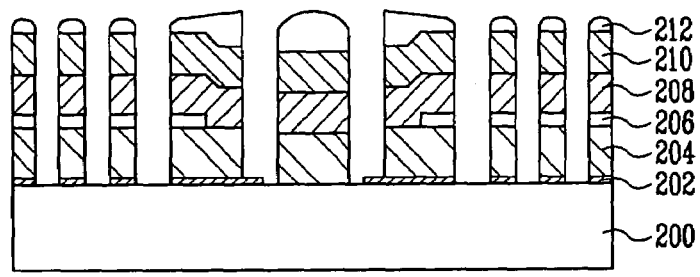
Figure 2F:
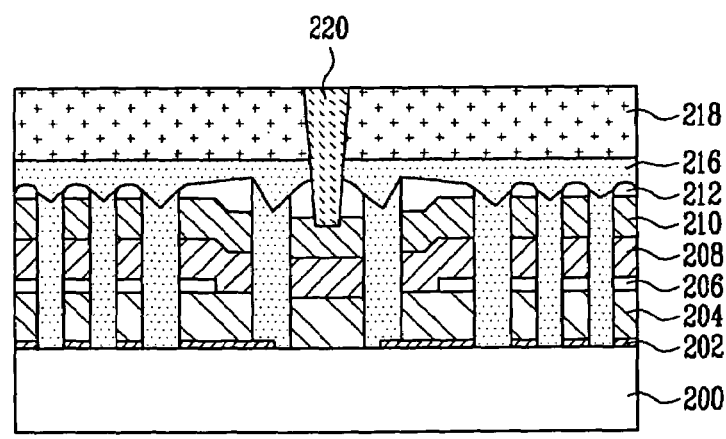

Referring to FIG. 2f, an insulating layer is formed in order to form a space in the gate of the peripheral transistor and is then blanket etched in the process step of FIG. 2e. An insulating layer is filled between a plurality of cell gates, the peripheral select transistor gate, and the source contact lines since the space is narrow.

Thereafter, a first interlayer insulating layer 216 is formed on the entire structure. After a second interlayer insulating layer 218 is formed, a photolithography process is performed on the region in which the source lines are formed to fill a conductive material, such as tungsten (W) or aluminum (Al), into the region. Accordingly, the region is connected to the conductive film 210 of the source lines to form contacts.

If the processes of FIGS. 2a to 2f are completed, a line for forming the source contact is added between the select transistors in the gate mask. Accordingly, since the DOF of the select transistor is increased, the select transistor size ("Select Tr Size") can be reduced. It is therefore possible to reduce the cost through the reduction of the die size depending on the reduction of an overall cell size.

Furthermore, since the source lines are formed simultaneously with the gate formation process, there is no need for an additional metal deposition step or metal polishing process for forming the source lines. This can save cost and it is also possible to eliminate a misalignment problem between the source contact mask and the gate select transistor in the related art.

According to an embodiment of the invention, since the line for forming the source contact is added between the select transistors in the gate mask, the DOF is increased. It is possible to shrink the select transistor size. Accordingly, the die size can be reduced and the cost can be saved depending on the reduction of an overall cell size.

While the invention has been described in connection with what is presently considered to be practical exemplary embodiments, the invention is not limited to the disclosed embodiments, but, on the contrary, is intended to cover various modifications and equivalent arrangements included within the spirit and scope of the appended claims.

What is claimed is:

1. A method of forming a source contact of a NAND flash memory, the method comprising the steps of:
    forming a tunnel oxide film over a semiconductor substrate, and then removing the tunnel oxide film in a region in which the source contact will be formed;
    forming a first polysilicon layer and a dielectric layer on the entire structure, and then removing the dielectric layer of a region in which select transistors will be formed;
    forming a second polysilicon layer over the regions from which the dielectric layer has been removed, forming a conductive film over the second polysilicon layer;
    performing an etch process using a gate mask to etch a cell region up to the dielectric layer and at the same time, to etch the region in which the source contact will be formed up to on the tunnel oxide film, thereby forming source lines;
    performing an ion implantation process on the semiconductor substrate exposed at both sides of the source lines;
    sequentially etching the dielectric layer, the first polysilicon layer, and the tunnel oxide film of the cell region and the select transistor region, forming a cell gate and a select transistor gate;
    burying an insulating layer between the cell gate and the select transistor gate, and the source contact, and then forming an interlayer insulating layer on the entire structure; and
    etching a desired region of the interlayer insulating layer to form contacts through which the source lines are exposed.

2. The method of claim 1, wherein the conductive film comprises tungsten (W) or aluminum (Al).

3. The method of claim 1, wherein the interlayer insulating layer includes a first interlayer insulating layer and a second interlayer insulating layer.

4. The method of claim 1, wherein the contacts comprise tungsten (W) or aluminum (Al).

* * * * *